United States Patent [19]
Casagrande et al.

[11] Patent Number: 5,659,516
[45] Date of Patent: Aug. 19, 1997

[54] VOLTAGE REGULATOR FOR NON-VOLATILE SEMICONDUCTOR ELECTRICALLY PROGRAMMABLE MEMORY DEVICES

[75] Inventors: Giulio Casagrande, Agrate Brianza; Emilio Camerlenghi, Bergamo, both of Italy

[73] Assignee: SGS-Thomson Microelectronics, S.r.l., Agrate Brianza, Italy

[21] Appl. No.: 368,211

[22] Filed: Jan. 3, 1995

[30] Foreign Application Priority Data

Dec. 31, 1993 [EP] European Pat. Off. ............. 93830542

[51] Int. Cl.$^6$ ...................................... G11C 13/00
[52] U.S. Cl. ........................... 365/226; 365/185.33
[58] Field of Search ..................... 365/226, 189.01, 365/218, 185.33

[56] References Cited

U.S. PATENT DOCUMENTS 5,168,466  12/1992  Kuo et al. ........................ 365/218

FOREIGN PATENT DOCUMENTS 145 254  6/1985  European Pat. Off. .
525 679  2/1993  European Pat. Off. .

*Primary Examiner*—Terrell W. Fears
*Attorney, Agent, or Firm*—Robert Groover; Betty Formby; Matthew Anderson

[57] ABSTRACT

A voltage regulator for electrically programmable non-volatile semiconductor memory devices of the type comprising a gain stage (3), supplied by a programming voltage (Vpp) and having an input terminal connected to a divider (6) of said programming voltage (Vpp) and an output terminal (U) connected to a programming line (5) of at least one memory cell (2) comprises at least one circuit element (4) capable of adapting the line programming voltage (5) to the length (L) of the memory cell (2). This provides a drain voltage, on the bit line of the memory device, which varies according to the actual length of the memory cell.

12 Claims, 5 Drawing Sheets

VOLTAGE REGULATOR FOR NON-VOLATILE SEMICONDUCTOR ELECTRICALLY PROGRAMMABLE MEMORY DEVICES

CROSS-REFERENCE TO RELATED APPLICATION

This application claims priority from EPC App'n 93830542.2, filed Dec. 31, 1993, which is hereby incorporated by reference. However, the content of the present application is not necessarily identical to that of the priority application.

BACKGROUND AND SUMMARY OF THE INVENTION

The present invention relates to a voltage regulator for electrically programmable non-volatile semiconductor memory devices.

More specifically the present invention relates to a voltage regulator of the type comprising a gain stage supplied by a programming voltage and having an input terminal connected to a divider of the programming voltage and an output terminal connected to a programming line of at least one memory cell.

As known an individual non-volatile memory cell comprises an MOS transistor in which the gate electrode located over the channel region is floating, i.e. displays high continuous impedance to all the other terminals of the same cell and of the circuit in which the cell is inserted.

The cell also includes a second electrode, called a control gate, which is piloted through appropriate command voltages. The other electrodes of the transistor are the usual drain, source and body terminals.

By applying appropriate voltages to the cell terminals it is possible to change the charge quantity present in the floating gate, e.g. utilizing known Fowler-Nordheim Tunnelling and/or Channel Hot Electron Injection phenomena. This allows placing the transistor in two logic stages: a first state with "high" threshold voltage and a second state with "low" threshold voltage.

If a voltage is applied at the control gate which is intermediate between these two values, it is possible to "read" the state of the transistor since it displays between the drain and source terminals a low or high impedance depending on the threshold voltage value. Therefore the transistor can be considered a logic memory element.

Since the floating gate presents a high impedance toward any other cell terminal, the charge stored therein can persist for an indeterminate time even if supply is removed from the circuit in which it is inserted. The cell therefore displays non-volatile memory characteristics.

The operation by which the charge is stored in the floating gate is termed "programming" while the operation by which the charge is removed from the floating gate is termed "erasure".

Generally a non-volatile memory circuit integrated on a semiconductor comprises a multiplicity of cells of the above type organized in rows (parallel to "word line" conductors) and columns (parallel to "bit line" conductors). The cells belonging to a given row share a word line which is connected to pilot all of their respective control gates, while the cells belonging to a given column have their drain terminals all connected together.

It is also known that non-volatile memory cells and in particular the FLASH type require accurate control of drain voltage Vd during the programming phase, i.e. the voltage applied on the bit line. The drain voltage must indeed satisfy several conditions listed below:

It must be high enough to allow fast cell programming, it must be at the same time low enough to avoid the so-called "soft-erasing" phenomenon, which consists of partial erasure of the cell or degradation of the characteristics of the cell with use, and for reliability reasons it must always be such as to avoid setting off the phenomenon known as "parasitic-bipolar" operation.

The optimal range for such a voltage is in general rather small and typically between 5 and 6 volts.

It is noted also that the conditions indicated above are variable depending on the production process and in particular depending on the length of the memory cell. The production processes indeed lead to variations in the dimensions of the cells and in particular of the polysilicon layers and this represents one of the critical parameters in production.

Taken all together the above observations lead to the conclusion that it is necessary to equip the memory circuit with a particularly refined and accurate voltage regulator to supply the correct voltage to the bit line in the programming phase.

The known art already proposes some solutions to meet this requirement.

In general since the voltages supplied from the outside to the memory circuit are substantially two and in particular a 5 V supply voltage Vcc and a 12 V programming voltage $V_{PP}$, control of drain voltage is normally achieved by division of the programming voltage $V_{PP}$.

In this manner there is achieved a drain voltage relatively stable as concerns temperature and the circuit production process parameters and variable by ±5% with the programming voltage $V_{PP}$.

In the annexed FIG. 1 is shown schematically a first circuit solution of known type provided by utilizing division of the programming voltage.

The voltage regulator shown in FIG. 1 comprises a resistive divider consisting of three resistances R1, R2, R3 connected between the programming voltage line $V_{pp}$ and ground. In parallel with the resistances is a group of four MOS transistors connected in series with each other through their respective source and drain terminals.

The gate terminals of the first transistor M1 and fourth transistor M4 are connected between the first and second resistances and between the second and third resistances.

The voltage applied to the bit line is taken on the gate terminal of the second transistor M2 which is inserted in the circuit in diode configuration with gate and drain short-circuited.

This voltage is actually applied to the bit line unless there is a negative translation of level due to the presence of a first selection transistor M6 and a second selection transistor M7 for writing.

Although advantageous from certain viewpoints, this solution is not entirely effective and displays some shortcomings.

As already mentioned, the programming current absorbed by the memory cell can vary from one integrated circuit to another because of the inevitable variations inherent in the production process. It can undergo variations also because of the surrounding conditions in which the circuit is made to operate.

If the current passing through the bit line and hence the output stage of the regulator is actually different from the one called for by the design it follows that the voltage on the bit line will also be wrong or different from that desired.

In addition, since during programming the threshold voltage of the cell tends to rise progressively it follows that the current absorbed by the cell decreases in time. Since with the circuit described above voltage regulation is based on an average programming current, it will not give good results steadily.

A second solution of the known art is shown in FIG. 2 and provides that the drain voltage be supplied by a so-called source-follower piloted by an operational amplifier with appropriate feedback connections.

Even this solution is not free of shortcomings. In particular, this circuit proved to be slow in the reading phase because it seems to increase the capacitance of the bit line.

In addition, it has been observed that with the decrease in the cell dimensions and in particular their actual length, ever closer limits are imposed on drain voltage variation range and this compromises the reliability and performance of the entire memory circuit.

The technical problem underlying the present invention is to conceive a voltage regulator which would supply the bit line constantly at the output with a voltage such as to pursue optimally production process variations.

In other terms, the purpose of the present invention is to conceive a voltage regulator capable of adapting to the actual length of the memory cell and overcoming the limits of the present solutions.

The solution idea underlying the present invention is to incorporate in the regulator a resistive network on which the voltage drop would be a function of the actual length of the memory cell.

On the basis of this solution idea the technical problem is solved by a voltage regulator which includes a voltage divider supplied by programming voltage Vpp. At least one element of the voltage divider is physically laid out to provide an impedance which varies in correspondence with variations in the length of the memory cells. This provides a drain voltage, on the bit line of the memory device, which varies according to the actual length of the memory cell. In the presently preferred embodiment, this one element is implemented by a series-connected string of transistors which are gated by Vpp. This provides the secondary advantage of some compensation for variation in Vpp.

The characteristics and advantages of the voltage regulation circuit in accordance with the present invention are set forth in the description of an embodiment thereof given below by way of non-limiting example with reference to the annexed drawings.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 3:
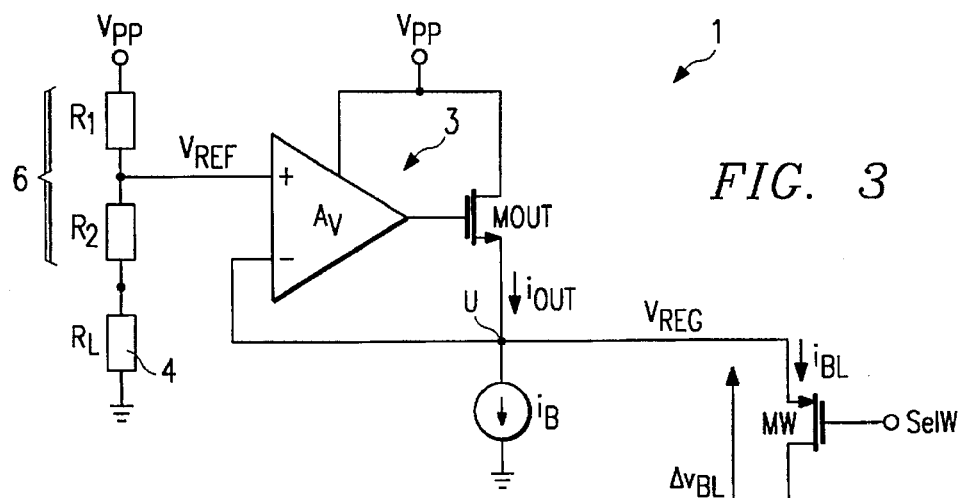
FIG. 3 shows a diagram of a first embodiment of the regulator in accordances with the present invention.

The numerous innovative teachings of the present application will be described with particular reference to the presently preferred embodiment (by way of example, and not of limitation), in which:

With reference to FIG. 3, 1 designates as a whole and schematically a programming circuit for at least one electrically programmable non-volatile memory cell 2, e.g. a FLASH cell.

The cell 2 together with other cells of the same type is provided with an MOS transistor with floating gate G equipped with another gate CG termed control gate.

The cells 2 are organized in columns with the respective source terminals S all connected to the same reference voltage, e.g. a signal ground GND, and with the respective drain terminals D connected together on a so-called bit line 5.

The bit line 5 also comprises a pair of MOS transistors MB and MW connected in series together for selection of the bit line.

The circuit 1 comprises a voltage regulator 3 designed in accordance with the present invention to regulate drain voltage of the cell 2 during programming thereof and designated below by Vd.

For this purpose the regulator 3 comprises a gain stage provided by an operational amplifier Av, e.g. with unit gain, in cascade with which is connected a source-follower stage. The follower stage comprises an MOS transistor Mout biased by a constant current generator Ib.

The amplifier Av has a non-inverting input on which is applied a voltage Vref to be repeated on an output of the regulator 3 to supply the load consisting of the bit line 5. The output U is connected in feedback on another inverting input of the amplifier Av.

The voltage Vref is achieved by division of a programming voltage VPP performed by a resistive divider 6 comprising a pair of resistors R1 and R2.

The resistances R1 and R2 are inserted between a voltage terminal $V_{PP}$ and the signal ground.

Advantageously in accordance with the present invention the regulator comprises at least one circuit element allowing adaptation of the output voltage to the electrical length L of the memory cell.

In the presently preferred embodiment, described here by way of non-limiting example, the element is a resistive network 4 connected in series with the divider 6 to ground.

Specifically the network 4 provides a variable resistivity between the resistor R2 and ground.

In the embodiment described here the network 4 comprises a series of MOS transistors M1, . . . , Mn of minimal area.

Figure 7:
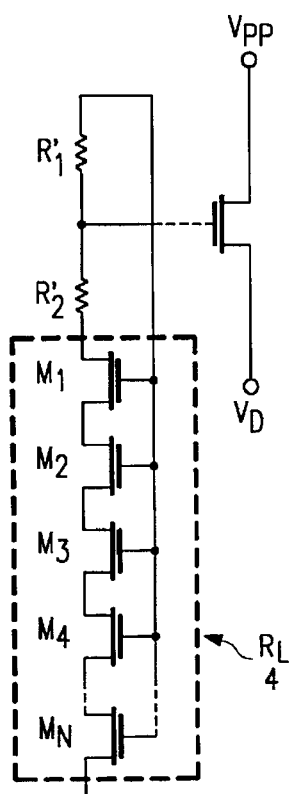
FIGS. 7 and 8 show diagrams of details of the regulator in accordance with the present invention.

These transistors are connected in series between the resistor R2 and ground, through the respective source and drain terminals. In the example of FIG. 7, the gate terminals of the transistors all lead to the programming voltage $V_{PP}$.

In this manner the network 4 compensates also for the percentage variations resulting from the normal oscillations of the programming voltage $V_{PP}$.

However, it is important to note that the connections of the gate terminals and in general the connections of all the terminals of the transistor M1, ..., Mn can be optimized with an adequate simulation.

Figure 8:
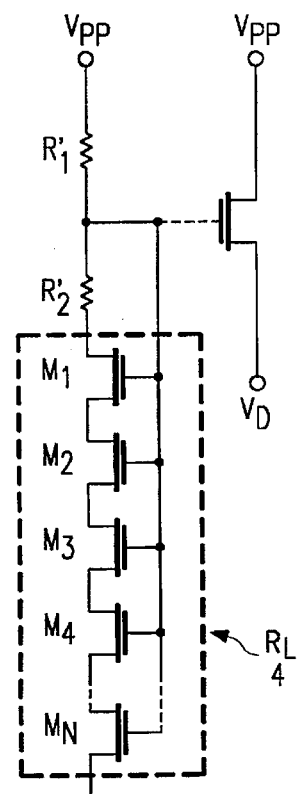
Figure 9A:
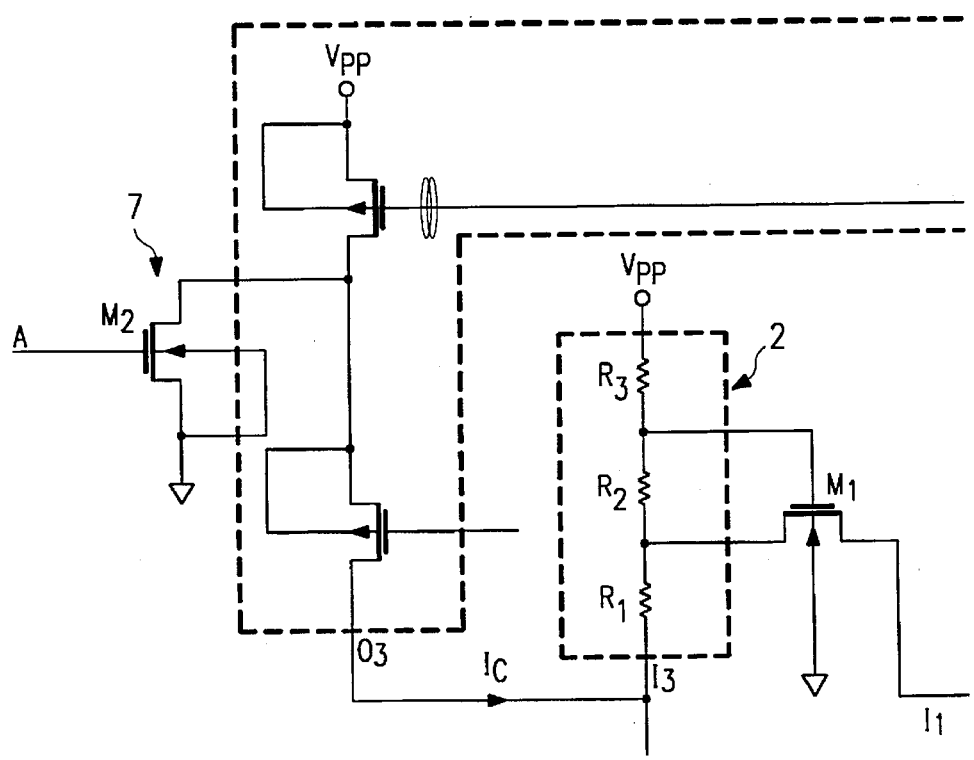
FIGS. 9A–9D are four sheets of a single figure which shows a drain voltage regulator in which the innovative regulator circuits of FIGS. 3, 4, 5, 6, 7, or 8 can be advantageously used.
Figure 9B:
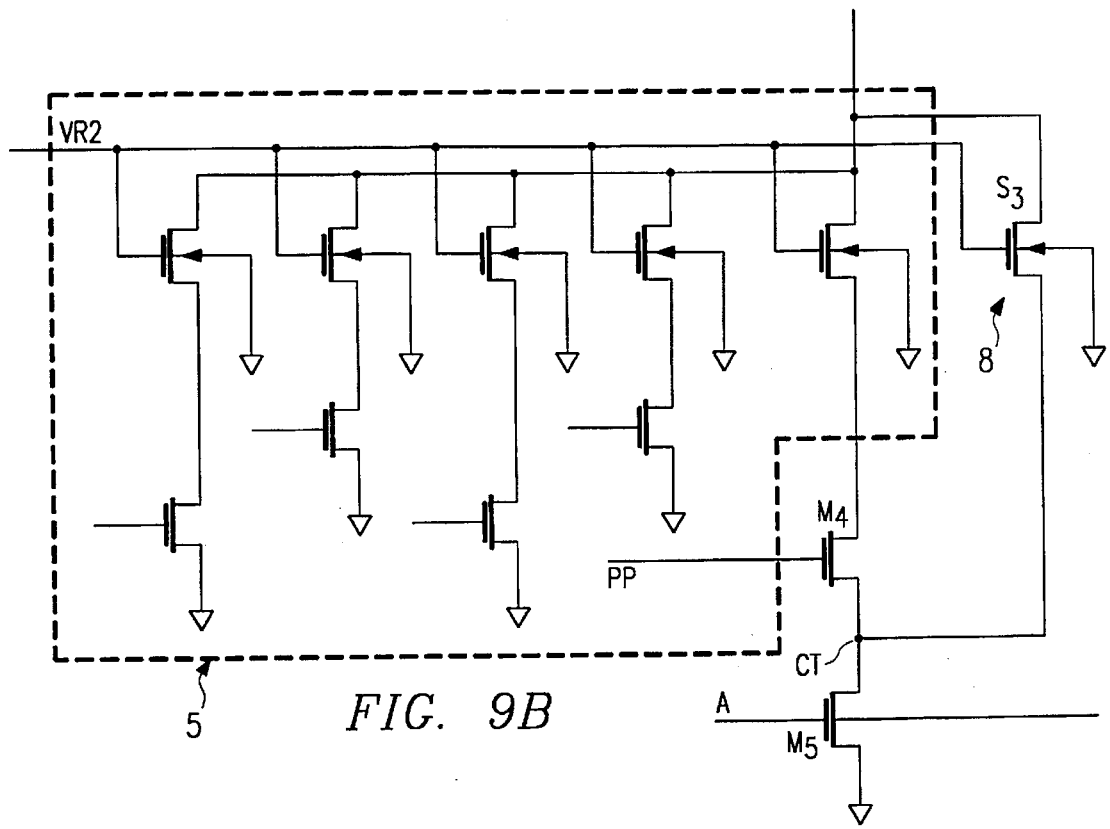
Figure 9C:
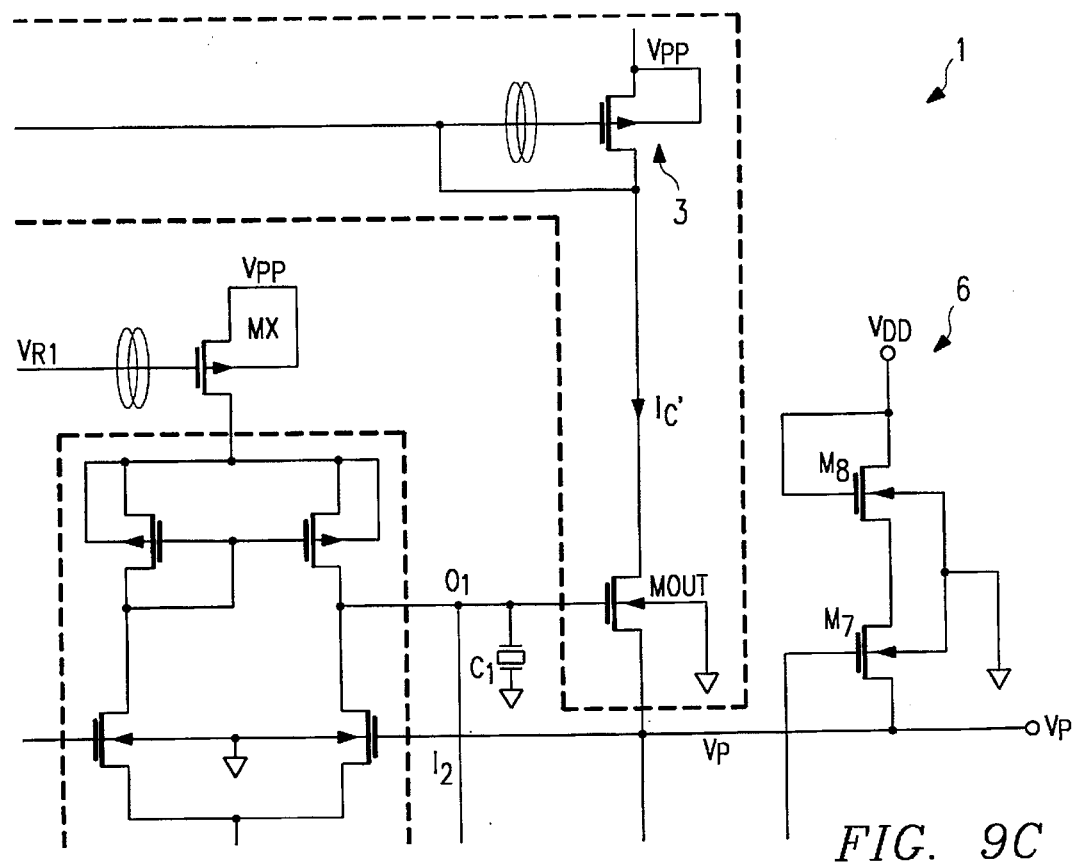
Figure 9D:
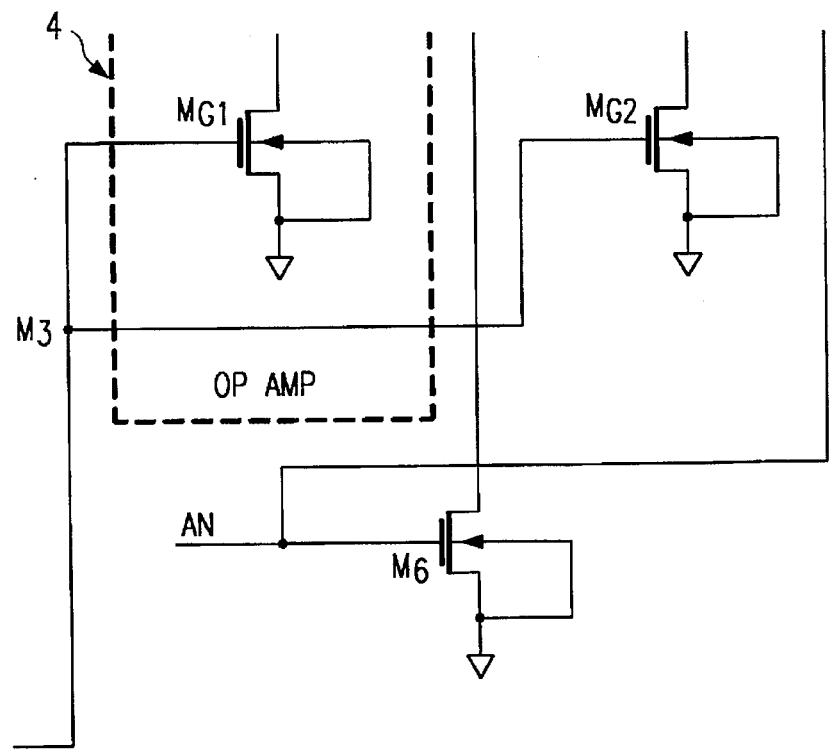

For example, an alternative solution provided again in accordance with the present invention is shown in FIG. 8 in which all the above transistors have their respective gate terminals connected to the interconnection point between the resistors R1 and R2.

Again in these cases the percentage variations of the voltage $V_{PP}$ are compensated even though indirectly.

In FIG. 7, as $V_{PP}$ increases, the transistors M1 through MN are turned on with a greater overdrive voltage, and hence jointly provide a lower net resistance. Hence, the fraction $$\frac{R2 + R4}{R1 + R2 + R4}$$

(wherein R4 is the equivalent resistance of transistors M1 through MN) becomes larger. Thus, variation in $V_{PP}$ will be at least partly compensated by an opposite variation in the voltage dividing fraction.

In FIG. 8, if $V_{PP}$ increases, and thereby (assuming that the effective resistance of the transistor chain was unchanged) would tend to increase the gate voltage of the transistors, this would tend to turn the transistors on more strongly and thereby pull the intermediate node down. Thus, again, this provides a countervailing influence to variations in $V_{PP}$.

Advantageously, the number and size of transistors in terms of amplitude W and length L of the channel region are regulated in such a manner that the network 4 has a resistivity correlated with the length of the memory cell 2.

Of course, the inventive solution proposed here is applicable in various circuit embodiments for programming circuit voltage regulators.

Figure 1:
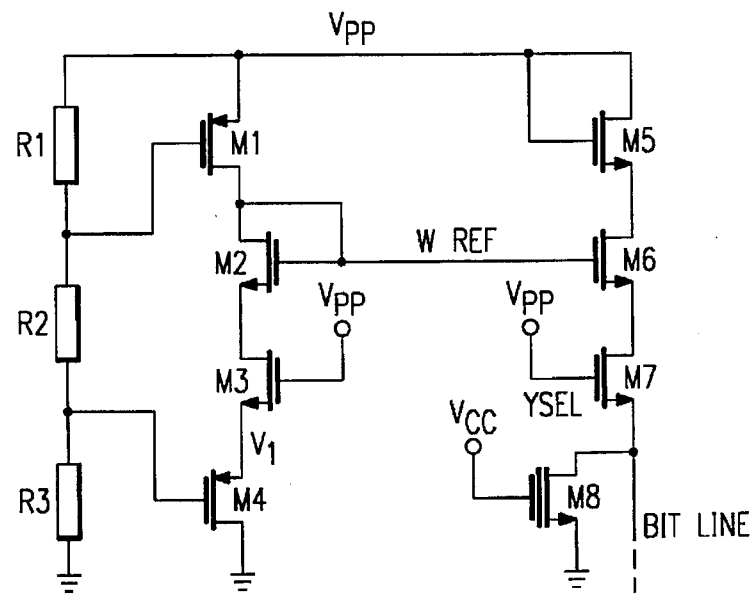
FIG. 1 shows a diagram of a programming circuit incorporating a voltage regulator achieved in accordance with the known art.
Figure 4:
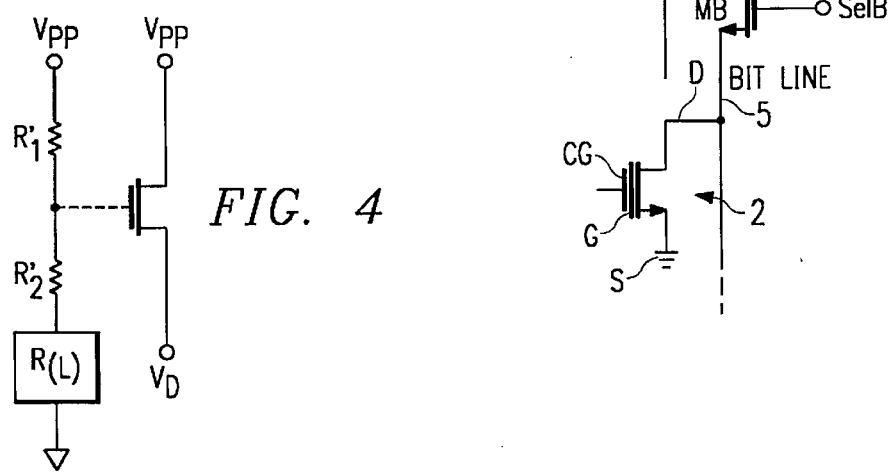
FIG. 4 shows a diagram of a second embodiment of the regulator in accordance with the present invention.
Figure 5:
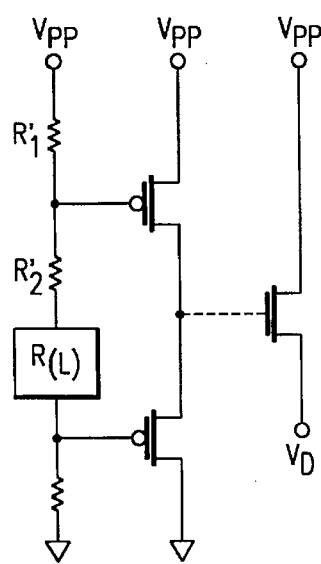
FIGS. 5 and 6 show diagrams of embodiments of the regulator of FIG. 1.
Figure 6:
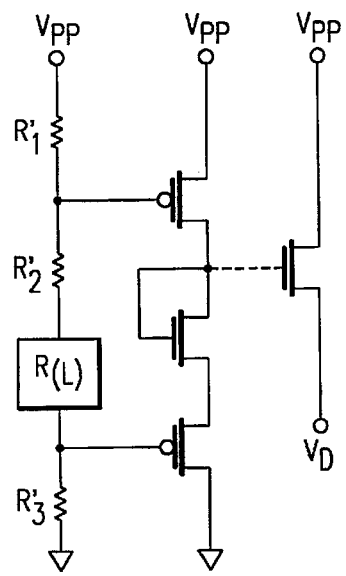

For example, with reference to FIGS. 4, 5 and 6 it can be appreciated that the network 4 can be inserted in the resistive divider 6, regardless of whether the gain stage of the regulator 3 is provided with a single transistor, a pair of transistors or transistors in series or parallel, as in the prior art solution of FIG. 1. (In these Figures the gain stage itself is omitted for clarity.)

Therefore, at the ends of the network 4 there is a voltage drop varying with the actual length of the memory cell. Specifically, the voltage drop increases with the length of the cell.

Concretely, having on the drain terminal D of the cell 2 a drain voltage varying with the actual length of the cell means being able to operate with cells having an actual length which can vary in a broader range, thus improving the performance, feasibility and reliability of the memory circuit.

In conclusion the main advantage of the voltage regulator in accordance with the present invention is to supply at output a voltage whose value is constantly and appropriately adapted to the dimensions of the cell.

This regulator is therefore particularly suited to supplying power to the bit line of an electrically programmable nonvolatile memory.

In addition, the configuration of the transistors incorporated in the network 4 with variable resistivity is such as to perform a partial compensation of the variations of the programming voltage $V_{PP}$ on the order of ±0.6 V thanks to the fact that the resistance is also variable with the programming voltage $V_{PP}$.

Thus, the disclosed voltage regulator provides the primary advantage of adapting the voltage value Vd to the length of the memory cell. The disclosed voltage regulator provides the secondary advantage of providing some compensation for variation of the programming voltage Vpp. If Vpp is (e.g.) 10 V, the present invention is believed to provide tolerance of Vpp variations of up to ±10%, as opposed to the typical ±5% maximum possible variation according to the prior art. However, the inventor remarks that this is not the main scope of the invention.

Figure 10:
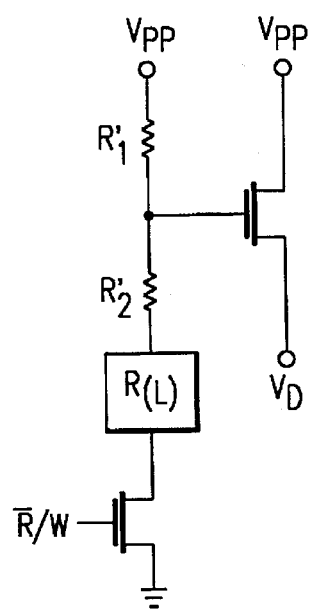
FIG. 10 shows a modification of the circuit of FIG. 4, in which a power-down transistor is added to reduce power consumption when writing operations are not required.

FIG. 10 shows a modification of the circuit of FIG. 4, in which a power-down transistor is added to reduce power consumption when writing operations are not required.

FIGS. 9A–9D are four sheets of a single figure which shows a detailed view of a drain voltage regulator into which the innovative regulator circuits of FIGS. 3, 4, 5, 6, 7, or 8 can advantageously be inserted. (The details of this drawing are described in European application 93830545.5, which is hereby incorporated by reference.)

According to a disclosed class of innovative embodiments, there is provided: A circuit for regulating the voltage applied to a bit line of a floating-gate memory, comprising: a voltage divider network connected between a programming voltage connection and chip ground; an array of floating-gate field effect transistor memory cells organized in bit lines; said voltage divider network including field effect transistors of the same conductivity type as said floating-gate field effect transistors; and a voltage regulator circuit, connected to drive at least a selected one of the bit lines of said array with a voltage which is determined by that of an intermediate point in said voltage divider.

According to another disclosed class of innovative embodiments, there is provided: A circuit for regulating the voltage applied to a bit line of a floating-gate memory, comprising: a voltage divider network connected between a programming voltage connection and chip ground; an array of floating-gate field effect transistor memory cells organized in bit lines; said voltage divider network including multiple field effect transistors of the same conductivity type as said floating-gate field effect transistors, and also including passive load elements which are not transistors; and a voltage regulator circuit, connected to drive at least a selected one of said bit lines of said array with a voltage which is equal to that of an intermediate point in said voltage divider.

According to another disclosed class of innovative embodiments, there is provided: A nonvolatile memory integrated circuit, comprising: an array of floating-gate field effect transistor memory cells organized in bit lines; a voltage divider network including field effect transistors of the same conductivity type as said floating-gate field effect transistors; and a voltage regulator circuit, connected to drive at least a selected one of said bit lines of said array with a voltage which is equal to that of an intermediate point in said voltage divider; whereby variations in the effective channel length of said memory cells produce corresponding variations in said regulated drain voltage, to provide an optimal regulated drain voltage.

According to another disclosed class of innovative embodiments, there is provided: A method for regulating the write voltage applied to bit lines in a nonvolatile memory chip, comprising the steps of generating a voltage at an intermediate node of a voltage divider, which depends on device parameters of N-channel field effect transistors, said voltage divider being connected between a programming voltage connection and chip ground; and when a bit line is selected for a write operation, using a voltage regulator which references said intermediate node of said voltage divider to apply a constant regulated voltage to said selected bit line; wherein said regulated voltage has little or no dependence on said programming voltage, and is optimized for the variations in the device characteristics of memory cells of the array.

According to another disclosed class of innovative embodiments, there is provided: A voltage regulator for electrically programmable non-volatile semiconductor memory devices, comprising: a gain stage supplied by a programming voltage and having an input terminal connected to a voltage divider which is connected to receive said programming voltage and an output terminal connected to a programming line of at least one memory cell and comprising at least one circuit element capable of adapting the line programming voltage to the length of the memory cell.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For example, as a modification of the embodiment of FIG. 7, the transistor gates could also be connected to a tap point somewhere within resistor $R_1$. Analogous modifications can be made to the other embodiments.

For another example, resistors R1 and R2 are well resistors, in the presently preferred embodiment, with a value in the neighborhood of 1MΩ; but these can be implemented in other ways, and their values can be adjusted to achieve the desired balance with the linewidth-dependent load 4.

Figure 2:
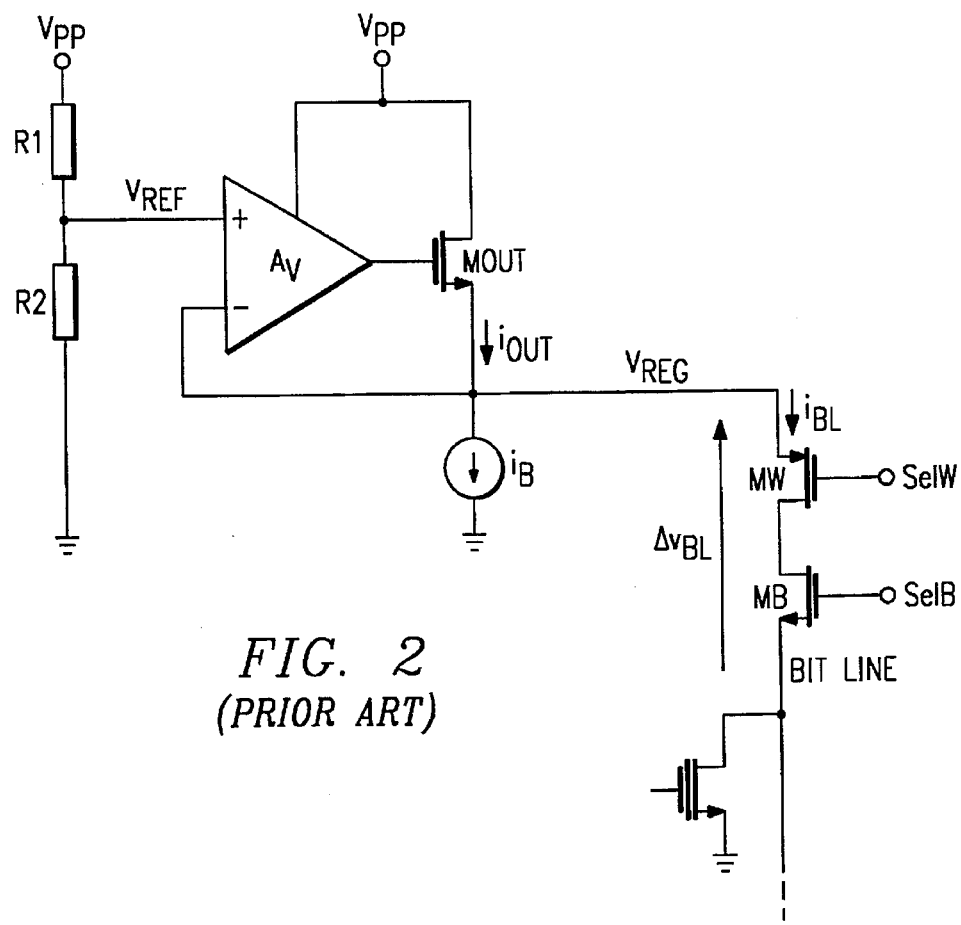
FIG. 2 shows another diagram of a programming circuit incorporating another voltage regulator of known type.

In addition, other implementations of the present invention may use other voltage regulator networks different from that shown in FIGS. 2 or 3.

In alternative embodiments, of course, other load elements can be used for partial or total replacement for the resistors shown. These may include not only polysilicon resistors or load resistors, but may also include NMOS or PMOS depletion devices, forward biased junction diodes or Schottky diodes, reverse biased avalanche break-down diodes, thin film transistors with polysilicon channels, etc.

Moreover, some further modifications, adaptable to the circuits of the present application, may be indicated in a copending application of the same inventors which describes a different drain regulator structure: this is copending application Ser. No. 08/367,538, entitled "Voltage Regulator for Non-Volatile Semiconductor Memory Devices" (Atty. Docket 93-AG-085/PCB-024). This application claims priority from EPC App'n 93830543.0 filed Dec. 31, 1993, and has an effective US filing date simultaneous with that of the present application. This application and its priority application are both hereby expressly incorporated by reference.

What is claimed is:

1. A circuit for regulating the voltage applied to a bit line of a floating-gate memory, comprising:

a voltage divider network connected between a programming voltage connection and chip ground;

an array of floating-gate field effect transistor memory cells organized in bit lines;

said voltage divider network including field effect transistors of the same conductivity type as said floating-gate field effect transistors; and a voltage regulator circuit, connected to drive at least a selected one of the bit lines of said array with a voltage which is determined by that of an intermediate point in said voltage divider.

2. The integrated circuit of claim 1, wherein said transistors of said voltage divider network each have respective gates connected to the driven by said intermediate node of said resistive divider.

3. The integrated circuit of claim 1, further comprising a plurality of bit line selection transistors, interconnected with logic so that said voltage regulator is only connected to one of said bit lines at a time, and only during a write mode operation.

4. The integrated circuit of claim 1, wherein said floating-gate memory cells are EEPROM cells.

5. A circuit for regulating the voltage applied to a bit line of a floating-gate memory, comprising:

a voltage divider network connected between a programming voltage connection and chip ground;

an array of floating-gate field effect transistor memory cells organized in bit lines;

said voltage divider network including multiple field effect transistors of the same conductivity type as said floating-gate field effect transistors, and also including passive load elements which are not transistors; and a voltage regulator circuit, connected to drive at least a selected one of said bit lines of said array with a voltage which is equal to that of an intermediate point in said voltage divider.

6. The integrated circuit of claim 5, wherein said transistors of said voltage divider network each have respective gates connected to the driven by said intermediate node of said resistive divider.

7. The integrated circuit of claim 5, further comprising a plurality of bit line selection transistors, interconnected with logic so that said voltage regulator is only connected to one of said bit lines at a time, and only during a write mode operation.

8. The integrated circuit of claim 5, wherein said floating-gate memory cells are EEPROM cells.

9. A nonvolatile memory integrated circuit, comprising:

an array of floating-gate field effect transistor memory cells organized in bit lines;

a voltage divider network including field effect transistors of the same conductivity type as said floating-gate field effect transistors; and a voltage regulator circuit, connected to drive at least a selected one of said bit lines of said array with a voltage which is equal to that of an intermediate point in said voltage divider;

whereby variations in the effective channel length of said memory cells produce corresponding variations in said regulated drain voltage, to provide an optimal regulated drain voltage.

10. The integrated circuit of claim 9, wherein said transistors of said voltage divider network each have respective gates connected to the driven by said intermediate node of said resistive divider.

11. The integrated circuit of claim 9, further comprising a plurality of bit line selection transistors, interconnected with logic so that said voltage regulator is only connected to one of said bit lines at a time, and only during a write mode operation.

12. The integrated circuit of claim 9, wherein said floating-gate memory cells are EEPROM cells.

* * * * *